United States Patent [19]

Yasui et al.

[11] Patent Number: 4,536,468

[45] Date of Patent: Aug. 20, 1985

[54] METHOD OF FORMING RESIST PATTERN

[75] Inventors: Toshihiko Yasui, Iruma; Tetsuo Matsumoto, Tokyo; Akihiko Akaike, Ageo, all of Japan

[73] Assignee: Dainippon Ink and Chemicals, Inc., Tokyo, Japan

[21] Appl. No.: 606,609

[22] Filed: May 3, 1984

[30] Foreign Application Priority Data

May 6, 1983 [JP] Japan .................................. 58-78241

[51] Int. Cl.$^3$ .............................................. G03C 5/00
[52] U.S. Cl. ...................................... 430/296; 427/44; 427/54.1; 204/159.19; 204/159.13; 430/281; 430/288; 430/322; 430/325; 430/328; 430/330
[58] Field of Search ............... 430/288, 281, 322, 325, 430/326, 328, 330, 296; 204/159.19, 159.13; 427/44, 54.1

[56] References Cited

U.S. PATENT DOCUMENTS

| | | | |
|---|---|---|---|
| 3,876,432 | 4/1975 | Carlick et al. | 430/288 |
| 4,064,287 | 12/1977 | Lipson et al. | 430/288 |
| 4,271,258 | 6/1981 | Watariguchi | 430/288 |
| 4,306,012 | 12/1981 | Scheve | 430/288 |

Primary Examiner—Jack P. Brammer
Attorney, Agent, or Firm—Sherman & Shalloway

[57] ABSTRACT

A method of forming a resist pattern, which comprises printing a predetermined pattern on a substrate by a lithographic technique using a resist ink curable by irradiation of an active energy ray and/or heating, said ink containing (1) a metal chelate resin obtained by reacting (a) at least one resin selected from the group consisting of alkyd resins, modified alkyd resins, fatty acid-modified epoxy resins, urethanized oils and maleinized oils and (b) a metal compound capable of forming a coordination bond using the resin (a) as a ligand and (2) a polymerizable compound containing at least two ethylenically unsaturated bonds per molecule; and curing the printed pattern by irradiating an active energy ray and/or by heating.

26 Claims, No Drawings

METHOD OF FORMING RESIST PATTERN

This invention relates to a method of forming a fine resist pattern, and more specifically, to an economical method of producing on a mass production basis a resist pattern of high resolution useful for production of finely worked articles such as a printed circuit.

Silk screen printing is presently a most widely used method for producing a resist pattern for printed circuits. Since, however, the resolution of the pattern obtained by this method corresponds to a line width of 100 to 200 microns at the highest, this method is no longer feasible for the formation of a resist pattern of high resolution which is now required in order to obtain finer patterns.

It is an object of this invention therefore to provide a method of forming a resist pattern of high resolution.

Another object of this invention is to provide a method of forming a resist pattern having excellent resisting properties in such treatments as etching, soldering and plating.

The above objects are achieved in accordance with this invention by a method of forming a resist pattern, which comprises printing a predetermined pattern on a substrate by a lithographic technique using a resist ink curable by irradiation of an active energy ray and/or heating, said ink containing (1) a metal chelate resin obtained by reacting (a) at least one resin selected from the group consisting of alkyd resins, modified alkyd resins, fatty acid-modified epoxy resins, urethanized oils and maleinized oils and (b) a metal compound capable of forming a coordination bond using the resin (a) as a ligand and (2) a polymerizable compound containing at least two ethylenically unsaturated bonds per molecule; and curing the printed pattern by irradiating an active energy ray and/or by heating.

The alkyd resin used as the resin (a) can be produced from a polybasic acid, a polyhydric alcohol and an oil or a long-chain fatty acid in a customary manner.

Examples of the polybasic acid component of the alkyd resin include aromatic dicarboxylic acids or their derivatives such as phthalic anhydride, isophthalic acid, terephthalic acid, dimethyl terephthalate, and tetrachlorophthalic anhydride; cyclic aliphatic dicarboxylic acids or their derivatives such as tetrahydrophthalic anhydride, hexahydrophthalic anhydride, 3,6-endomethylene-$\Delta^4$-phthalic anhydride, and 1,4,5,6,7,7-hexachlorobicyclo[2.2.1]-5-heptene-2,3-dicarboxylic anhydride; saturated or unsaturated aliphatic dicarboxylic acids or their derivatives such as succinic acid, adipic acid, dodecanedicarboxylic acid, sebacic acid, azelaic acid, maleic anhydride, fumaric acid, itaconic acid, succinic anhydride, octenylsuccinic anhydride, dodecenylsuccinic anhydride, methylsuccinic anhydride, a dimer of methacrylic acid and its methyl ester; and tri- or tetra-carboxylic acids such as rosin-maleic anhydride adduct, trimellitic anhydride, 1,2,4,5-benzenetetracarboxylic anhydride and benzophenonetetracarboxylic anhydride.

Examples of the polyhydric alcohol component that can be used include diols in which two alcoholic hydroxyl groups are spaced from each other by 2 to 9 carbon atoms, such as ethylene glycol, propylene glycol, butanediol, neopentyl glycol, 1,6-hexanediol, 1,4-cyclohexanedimethanol and hydrogenated bisphenol A; triols such as glycerol, trimethylolethane and trimethyolpropane; and tetrols such as pentaerythritol.

Examples of the oil components that can be used include drying oils such as linseed oil, dehydrated castor oil, soybean oil and safflower oil; semidrying oils such as bran oil, rapeseed oil and cotton seed oil; and non-drying oils such as castor oil and coconut oil. The fatty acids of these may also be used.

Stearic acid, palmitic acid, oleic acid, linoleic acid, linolenic acid and lauric acid constituting the above-exemplified oils may, for example, be used as the long-chain fatty acid component. There can also be used resin solids constituting commercial goods such as "Beckosol 1343", "Beckosol 1313", "Beckosol EL-5007", and "Beckosol P-470-70" (tradenames for products of Dainippon Ink and Chemicals, Inc.).

One example of the modified alkyd resin used as the resin (a) can be produced by feeding a modifying component, for example a rosin such as gum rosin, wood rosin, tall oil rosin, an initial condensate of formaldehyde and a phenolic compound such as phenol, o-, m- or p-cresol, xylenol, p-tert-butylphenol or p-phenylphenol, an epoxy resin typified by a bisphenol A-type epoxy resin, or an initial condensation product of dimeric acid and an organic polyamine such as ethylenediamine, tetramethylenediamine or piperazine, into the reaction system in the production of an alkyd resin, further optionally feeding an acid anhydride into the reaction system, and performing polycondensation reaction. The resulting resins are called rosin-modified alkyd resins, phenol-modified alkyd resins, epoxy resin-modified alkyd resins, and amide resin-modified alkyd resins. For example, resin solids constituting "Beckosol 1303" (rosin-modified alkyd resin), and "Beckosol 134" and "Beckosol M-2151" (both are phenol-modified alkyd resins) commercially available from Dainippon Ink and Chemicals Inc. can be used.

Another example of the modified alkyd resin can be produced by producing an alkyd resin, thereafter charging a modifying component, for example an amino resin, a siloxane intermediate (for example, "SH6018" and "QI-3037 Resin" marketed by Toray Silicone Company, and "KP-213" marketed by Shin-etsu Chemical Co., Ltd.), styrene, vinyltoluene, a (meth)acrylic ester, (meth)acrylic acid, acrylonitrile, or a polyisocyanate compound such as tolylene diisocyanate, meta-phenylene diisocyanate, 1,6-hexamethylene diisocyanate, isophorone diisocyanate, xylylene diisocyanate or p-di(isocyanatomethyl)cyclohexane in the presence or absence of an organic solvent into the reaction system, optionally charging an acid anhydride in the reaction system, and thereafter performing addition, condensation or polymerization, and then optionally distilling off the organic solvent. These modified alkyd resins are called amino-alkyd cocondensed resins, silicone-modified alkyd resins, styrenated alkyd resins, vinyltoluene-modified alkyd resins, acrylic-modified alkyd resins, acrylonitrile-modified alkyd resins and urethane-modified alkyd resins. For example, there can be used resin solids constituting "Beckosol M-7606-55MV" (an amino-alkyd cocondensed resin produced by Dainippon Ink and Chemicals, Inc.), "TSR-180" and "TSR-184" (silicone-modified alkyd resins made by Toshiba-Silicone Company), "Styresol 4250" and "Styresol 4400" (styrenated alkyd resins produced by Dainippon Ink and Chemicals, Inc.", "Phtalkyd V-90" and "Phtalkyd-V-904" (acrylic-modified alkyd resins produced by Hitachi Chemical Co., Ltd.). and "Burnock M-5303" (urethane-modified alkyd resin produced by Dainippon Ink and Chemical, Inc.).

The fatty acid-modified epoxy ester resin used as the resin (a) can be produced by condensing an epoxy resin typified by bisphenol A-type epoxy resins (for example, "Epikote 1004" produced by Yuka Shell Epoxy Company) together with the above-exemplified oil fatty acid or long-chain fatty acid, and optionally reacting the product further with an acid anhydride. For example, a resin solid constituting "Beckosol P-786-50" (a product of Dainippon Ink and Chemicals, Inc.) can be used.

The urethanized oil used as the resin (a) can be produced by alcoholyzing the aforesaid oil or fat with a polyhydric alcohol such as glycerol or trimethylolpropane, subjecting the product to addition reaction with the aforesaid polyisocyanate compound, and optionally reacting the product further with an acid anhydride. For example, a solid of a modified oil constituting "Burnock TD-125" (a product of Dainippon Ink and Chemicals, Inc.) can be used.

The maleinized oil used as the resin (a) can be produced by reacting the aforesaid drying oil with maleic anhydride in a customary manner. If desired, a modified resin obtained by further reacting the product with the polyhydric alcohol component exemplified above can also be used as the resin (a).

To make it easy to remove the resist pattern after etching or plating, the resin (a) desirably has an acid value of 5 to 300, preferably 20 to 100. There is no particular restriction on the content of the long-chain fatty acid residue contained in the resin (a). To obtain surely a fine printed pattern free from holes, it is sufficient that the content of the long-chain fatty acid residue is at least 5% by weight in the resin (a), preferably at least 20%.

The acid anhydrides exemplified hereinabove as the polybasic acid component may be used for adjusting the acid value of the resin (a).

Examples of the metal compound (b) capable of forming a coordination bond using the resin (a) as a ligand include long-chain fatty acid salts of metals such as Be, Mg, Ca, Sr, Ba, Zn, Cd, Sc, Al, Ti, Zr, V, Cr, Mn, Fe, Co, Ni, Cu and Ce; alcoholates of these metals; intramolecular complex compounds having the aforesaid metal as a central atom and $\beta$-diketone compounds or $\beta$-keto ester compounds as a ligand; and intramolecular complex compounds having these metals in the alkoxylated form as a central atom and $\beta$-diketone compounds or $\beta$-keto ester compounds as a ligand. Typical examples of the alkoxy group in the metal alcoholates or the intramolecular complex compounds are methoxy, ethoxy, propoxy and butoxy groups. Typical examples of the $\beta$-diketone compounds which can be used as the ligand are acetylacetone, trifluoroacetylacetone, benzoylacetone, benzoyltrifluoroacetone and dibenzoylmethane. Typical examples of the $\beta$-keto ester compounds are ketocarboxylic acid esters having a carbonyl group at the $\beta$-position and enol-type compounds (the isomers thereof), such as acetoacetic esters, benzoylacetic esters, 2-carboalkoxycyclohexanones and salicyclic esters. Among these compounds, examples of those which can be easily obtained commercially and can be used preferably in this invention include copper compounds such as copper (II) octoate, copper (II) ethylaceto-acetate-sec-butoxide, copper (II)-n-butoxide and ethylacetoacetate copper (II) isopropylate; vanadium compounds such as vanadium oxydi-sec-butoxide, diisopropoxyvanadium-bis-(methylacetoacetate) and vanadium octoate; chromium compounds such as isopropoxychromium (III) ethylacetoacetate and chromium octylate; aluminum compounds such as aluminum 2-ethylhexoate, mono-sec-butoxyaluminum-diisopropoxide, ethylacetoacetate aluminum-diisopropoxide, aluminum-diisobutoxide mono(methylacetoacetate), and aluminum tris(ethylacetoacetate); bis-(isopropoxy)-bis-(acetylacetone)-titanium, titanium lactate, titanium lactate ethyl ester, titanium stearate, di-n-butoxy-bis(triethanolamine)titanate, tetraoctylene glycol titanate and diisopropoxy-bis(ethylacetoacetate)titanate; zirconium compounds such as zirconium ammonium lactate, diisopropoxy-bis(acetylacetonate)zirconate, n-butoxy-tris(ethylacetoacetate)zirconate, di-isopropoxy-(monoacetylacetonate)monoethylacetoacetate zirconate, zirconium stearate trisoctoate and zirconium laurate tris(2-ethylhexoate); manganese compounds such as manganese octylate, manganese (II) ethylacetoacetatemonoisopropoxide, and manganese (II) diisopropoxide; iron compounds such as iron (III) isopropoxide, iron (III) octylate, and iron (III)-diisobutoxide mono(ethylacetoacetate); and cobalt compounds such as cobalt (III)-diisopropoxide acetylacetonate, cobalt (III)-diisopropoxide-methyl acetoacetate and cobalt octylate.

The metal chelate resin (1) can be obtained by reacting the resin (a) with the metal compound (b) at 90° to 120° C. for 0.5 to 2.0 hours. The proportion of the metal compound (b) is preferably 0.1 to 10 parts by weight per 100 parts by weight of the resin (a).

Examples of the polymerizable compounds containing at least two ethylenically unsaturated double bonds per molecule include poly(meth)acrylates of ethylene glycol, polyethylene glycol, propylene glycol, polypropylene glycol, 1,3-butylene glycol, tetramethylene glycol, hexamethylene glycol, trimethylolpropane, glycerol or pentaerythritol; di(meth)acrylates of a diol obtained by adding at least 2 moles of ethylene oxide or propylene oxide to 1 mole of neopentyl glycol; di- or tri-(meth)acrylates of a triol obtained by adding at least 3 moles of ethylene oxide or propylene oxide to 1 mole of trimethylolpropane; and di(meth)acrylates of a diol obtained by adding at least 2 moles of ethylene oxide or propylene oxide to 1 mole of bisphenol A.

Polymerizable prepolymers can also be used as the polymerizable compound (2). Examples of the prepolymer are epoxy (meth)acrylates or their long-chain fatty acid-modified products obtained by reacting a bisphenol A-type epoxy resin with (meth)acrylic acid, and optionally with a long-chain fatty acid such as coconut oil fatty acid; epoxy(meth)acrylates and their modified products, such as epoxy(meth)acrylate having a carboxyl group obtained by adding a dibasic acid anhydride, a tetrabasic acid dianhydride or trimellitic anhydride to epoxy(meth)acrylate having a hydroxyl group; and the various polymerizable prepolymers described in U.S. Pat. Nos. 3,020,255, 3,377,406, 3,455,801, 3,455,802, 3,483,104, 3,470,079, 3,485,732, and 3,485,733.

The preferred proportion of the polymerizable compound (2) is 3 to 300 parts by weight per 100 parts by weight of the metal chelate resin (1). If the proportion of the polymerizable compound (2) is less than 3 parts by weight, the curability of the ink is extremely reduced, and the resulting resist pattern is not dry to the touch of a finger. Furthermore, the etching resistance of the resist pattern tends to be reduced. If the proportion of the compound (2) exceeds 300 parts by weight, the suitability of the ink for lithography is reduced extremely, resulting in a tendency to scumming or reduced levelling property.

The active energy ray may, for example, be ultraviolet light or an electron beam. When ultraviolet light is to be used, the resist ink usually contains a photopolymerization initiator in addition to the aforesaid ingredients.

Illustrative of the photopolymerization initiator used at this time are acyloins and their derivatives, such as benzoin, benzoin methyl ether, benzoin ethyl ether, benzoin isopropyl ether, benzoin isobutyl ether, decyl bromide and α-methylbenzoin; carbonyl compounds such as acetophenone, benzophenone, 2-methylanthraquinone, thioxanthone, cyclohexanone, methyl o-benzoylbenzoate and 9-fluoronone; diketones such as benzil and diacetyl; organic sulfides such as diphenyl monosulfide, diphenyl disulfide, decylphenyl sulfide and tetramethyl thiuram monosulfide; tertiary amino group-containing compounds such as p-dimethylaminobenzaldehyde, p-dimethylaminoacetophenone, 4-dimethylaminobenzonitirle, amyl p-dimethylaminobenzoate, p-dimethylaminobenzophenone and p,p'-tetraethyldiaminobenzophenone; sulfonyl halides such as p-toluenesulfonyl chloride, 1-naphthalenesulfonyl chloride, 2-naphthalenesulfonyl chloride, 1,3-benzenedisulfonyl chloride, 2,4-dinitrobenzenesulfonyl bromide and p-acetamidobenzenesulfonyl chloride; halogenated hydrocarbons such as carbon tetrachloride, carbon tetrabromide, tetrachloroethylene, hexachloroethane, hexabromoethane, iodo-form and 1,1,2,2,-tetrabromoethane; and dyes such as eosine, thionine, fluorescein, rivoflavin and 3,6-diaminoacridine. These known photopolymerization initiators may be used singly or in combination. Although there is no particular restriction on the amount of the photopolymerization initiator used, its suitable amount is usually from 0.5 to 20% based on the total weight of the metal chelate resin (1) and the polymierizable compound (2) in view of photocurability and economy.

The resist ink used in this invention contains the metal chelate resin (1) and the polymerizable compound (2) as essential ingredients and optionally further contains the photopolymerization initiator. As required, it may further contain as a diluent a polymerizable monomer containing one ethylenically unsaturated double bond per molecule such as styrene-type monomers, acrylic monomers and vinyl ester monomers. If further required, the resist ink may additionally contain known materials, for example a thermosetting resin such as a phenolic resin, a urea resin, a melamine resin, an unsaturated polyester resin, a silicon resin, an epoxy resin, a xylene resin, a ketone resin and a polyurethane resin; a blocked polyisocyanate compound in which at least a part of the active isocyanate groups is blocked with an active hydrogen-containing compound; a thermopolastic resin such as a vinyl chloride resin, a vinylidene chloride resin, a vinyl acetate resin, a methacrylic resin, an acrylic resin, a polystyrene resin, a polyamide resin, a polyethylene resin, a fluorine resin, a polypropylene resin, a polycarbonate resin, a polyester resin, a polyether resin, polybutadiene and a phenoxy resin; a petroleum resin; a maleic acid resin; a rosin-modified phenolic resin; a coloring pigment; a body extender pigment; a defoamer or a levelling improver, such as a silicone; a surface-active agent such as a polyoxyethylene glycol alkyl ether and an alkyl benzyl ammonium chloride; an anti-skinning agent such as eugenol and methyl ethyl ketoxime; a drying controlling agent such as sodium p-toluenesulfinate, a tertiary amino compound and triphenylphosphine; a thickener such as organic bentonite and silica gel; a polymerization regulating agent such as dodecyl mercaptan and pentaerythritol tetrakis(β-mercaptopropionate); a storage stabilizer such as phenyl phosphite and diethylhydroxylamine; an adhesion improver such as acryloxyethyl phosphate and a silane-coupling agent; and a polymerization inhibitor such as p-benzoquinone, hydroquinone, hydroquinone monomethyl ether, p-tert-bulylcatechol, mono-tert-bulylhydroquinone, pyrogallol, phenothiazine and cuprous chloride. Furthermore, as required, the ink may contain a small amount of a known organic solvent in order to adjust the flowability of the ink.

There is no particular restriction on the method of preparing the resist ink used in this invention. It can be easily produced by a kneading device such as a three-roll mill or a kneader.

According to the method of this invention, a predetermined pattern is printed on a substrate by a lithographic printing technique using the aforesaid resist ink. Printing may be wet printing or dry printing. The substrate may be any of those substrates which are normally used for making printing circuit boards. In many cases, a hard or flexible copper-clad print substrate is used. A known ultraviolet light irradiating device or electron beam irradiating device can be used as a source of active energy in exposing the pattern printed on the substrate to an active energy ray to cure it. A known heating device may be used as a source of heat.

When the resist ink in accordance with this invention is used, the printed pattern is substantially free from holes such as pinholes and eye holes. If it is desired to take an appropriate measure to prevent the formation of a minute hole which may sometimes occur, it is recommended to heat the printed pattern preliminarily before curing it by the irradiation of the active energy ray or by heating. This preliminary heating renders the printed pattern easily flowable, and this flowability is conductive to the formation of a hole-free continuous film. Conveniently, the flowability of the pattern at this time is not so strong as to cause the disorder of the pattern itself. No clear reason has yet been assigned to the occurrence of this convenient phenomenon, it is presumably due to the very thin film of the printed pattern. This preliminary heating should be carried out at a lower temperature than the curing temperature of the printing ink for a period of time sufficient for the creation of flowability required for removing holes. Accordingly, suitable heating conditions differ mainly depending upon the properties of the resist ink used. Generally, heating is suitably carried out at a temperature of not more than 150° C. for 15 to 60 seconds.

Instead of such preliminary heating, overprinting of the pattern is also effective for the accurate removal of holes. Overprinting may be carried out by printing the same pattern using one plate, or by mounting plates of the same pattern on two or more plate cylinders of a printing press and printing the same pattern by using these plates alternately. Preferably, the aforesaid preliminary heating is carried out after this overprinting.

The following examples illustrate the present invention more specifically. These examples are merely illustrative, and do not in any way limit the present invention. All parts and percentages in these examples are by weight.

EXAMPLES AND COMPARATIVE EXAMPLES

(1) Synthesis of a Vehicle

A pressure-reducible four-necked round-bottomed flask equipped with a thermometer, a stirring device, an air introducing tube, a condenser and a decanter was charged with a resin component, trimellitic anhydride, a monomer component, and a polymerization inhibitor (2,000 ppm based on the monomer component) in the amounts indicated in Table 1. While air was slightly blown into the flask, the above materials were stirred at 120° and 20 to 30 mmHg. Thus, the solvent in the resin component was distilled off, and the resin and trimellitic anhydride was subjected to addition reaction.

At the end of the above reaction, the reaction mixture was maintained at 150° C. while blowing air, and each of the metal compounds shown in Table 1 and a diluent for it (3 times the amount of the metal compound of n-heptane). The mixture was stirred for about 1 hour at the same temperature. Then, it was further stirred at 105° C. and 20 to 30 mmHg for 0.5 hour to distill off the diluting solvent in the metal compound.

By the above procedure, vehicles A to K shown in Table 1 were obtained.

(2) Preparation of a Resist Ink

Each of the vehicles obtained and the ingredients shown in Table 2 were thoroughly kneaded on a three-roll mill. Thus, resist inks Nos. 1 to 11 were prepared. For comparison, a resist ink No. 12 was prepared by thoroughly kneading the ingredients indicated in Table 3 by a three-roll mill.

TABLE 1

| Vehicle | Resin (trade name) | Parts | Non-volatile content (%) | Trimellitic anhydride (parts) | Metal compound (parts) | Monomer components (parts) |
|---|---|---|---|---|---|---|
| A | Rosin-modified alkyd resin (Beckosol 134) | 100 | 60 | — | Aluminum octoate (1.4) | Trimethylolpropane triacrylate (60) |
| B | Fatty acid-modified epoxy-ester resin (Bellosol P-786-50) | 100 | 50 | 3.0 | Aluminum isobutoxide monomethyl acetoacetate (0.8) | Trimethylolpropane triacrylate (50) |
| C | Amino-alkyd cocondensate resin (Beckosol M-7606-55MV) | 100 | 55 | — | Aluminum diisopropoxide monoethylacetoacetate (1.1) | Trimethylolpropane triacrylate (55) |
| D | Silicone-modified alkyd resin (TSR-180) | 100 | 50 | — | Aluminum diisopropoxide monoethylacetoacetate (3.5) | Trimethylolpropane triacrylate (50) |
| E | Alkyd resin (Beckosol 1343) | 100 | 50 | — | Aluminum tris-(ethylacetoacetate) (1.0) | Trimethylolpropane triacrylate (50) |
| F | Acrylic-modified alkyd resin (Phtalkyd V901) | 100 | 50 | 3.0 | Diisopropoxy-bis(acetylacetonate) zirconate (1.0) | Trimethylolpropane triacrylate (50) |
| G | Rosin-modified alkyd resin (Beckosol 1303) | 100 | 50 | — | Titanium lactate (1.0) | Triacrylate of a propylene oxide adduct of trimethylolpropane (50) |
| H | Urethane-modified alkyd resin (Burnock M-5303) | 100 | 60 | 4.2 | Vanadium oxydi-sec-butoxide (1.0) | Trimethylolpropane diacrylate monobenzoate (50) |
| I | Styrenated alkyd resin (styresol 4250) | 100 | 50 | 3.0 | Aluminum isobutoxide monomethylacetoacetate (1.2) | Trimethylolpropane triacrylate (50) |
| J | Alkyd resin (Beckosol 1313) | 100 | 50 | — | Aluminum isobutoxide monomethylacetoacetate (1.2) | Trimethylolpropane triacrylate (50) |
| K | Alkyd resin (Beckosol EL-5007) | 100 | 50 | 3.0 | Aluminum isobutoxide monomethylacetoacetate (1.2) | Trimethylolpropane triacrylate (50) |

TABLE 2

| Vehicle No. | Vehicle | (parts) | Trimethylolpropane triacrylate (parts) | Epoxy acrylate (parts) (*) | Dimethoxyphenyl acetophenone (parts) | Phthalocyanine Blue pigment (parts) |
|---|---|---|---|---|---|---|
| 1 | A | (87) | 6 | — | 5 | 2 |
| 2 | B | (84) | 9 | — | 5 | 2 |
| 3 | C | (86) | 7 | — | — | 2 |
| 4 | D | (93) | 3 | — | 5 | 2 |
| 5 | E | (87) | 6 | — | 5 | 2 |
| 6 | F | (88) | 5 | — | — | 2 |
| 7 | G | (84) | 9 | — | 5 | 2 |
| 8 | H | (83) | 10 | 5 | 5 | 2 |

TABLE 2-continued

| Vehicle No. | Vehicle | (parts) | Trimethylolpropane triacrylate (parts) | Epoxy acrylate (parts) (*) | Dimethoxyphenyl acetophenone (parts) | Phthalocyanine Blue pigment (parts) |
|---|---|---|---|---|---|---|
| 9 | I | (85) | 12 | 5 | — | 2 |
| 10 | J | (87) | 6 | — | 5 | 2 |
| 11 | K | (86) | 7 | — | 5 | 2 |

(*): "Diclite UE-8200", a product of Dainippon Ink and Chemicals, Inc.

TABLE 3

| Ink No. 12 | |
|---|---|
| Ingredients | Parts |
| Rosin-modified acrylate(*1) | 40 |
| Epoxy acrylate(*2) | 10 |
| Barium sulfate | 50 |
| Dipentaerythritol hexaacrylate | 15 |
| Phthalocyanine Blue pigment | 4 |
| 2-Ethylanthraquinone | 4 |
| Varnish(*3) | 24 |
| Surface-active agent | 1 |

(*1)"MAH-W", a product of Mitsubishi Petrochemical Co., Ltd.
(*2)"Diclite UE-8200", a product of Dainippon Ink and Chemicals, Inc.
(*3)A varnish obtained by stirring at 130° C. for 120 minutes 40 parts of rosin-modified acrylate (MAH-W), 40 parts of epoxy acrylate (Diclite UE-8200) and 5 parts of aluminum isobutoxide monomethyl acetoacetate.

(3) Formation of a Resist Pattern

Using the resist ink prepared as above, a resist pattern was formed on each of a glass epoxy-type hard copper-clad substrate, a polyimide-type flexible copper-clad substrate, a stainless steel plate, a nickel alloy plate and a glass plate.

The pattern was formed by various methods comprising combinations of the following steps. These methods are summarized in Table 4.

STEP A1

A step of printing by a sheet-fed lithographic printing press having mounted thereon a wet lithographic printing plate (aluminum plate) having the line image portion of an etching test pattern, a solder test pattern or a plating test pattern (all of which had a minimum line width of 50 microns) for printed circuit boards or the line image portion of a test pattern for glass decoration.

STEP A2

A step of printing by a dry lithographic printing press having mounted thereon a dry lithographic printing plate (having an ink-repelling silicone layer) having a line image portion of the same pattern as above.

STEP B

A step of preliminarily heating of the printed pattern by an infrared heating device. This device had four infrared lamps each having a filament length of 75 cm and an output of 3.75 W and arrayed parallel to each other at intervals of 15 cm, and was adapted to heat the printed matter at a position 10 cm below the lamps. The heating time was 5.5 seconds.

STEP C1

A step of heat curing the printed pattern by a hot air drying device at a heating temperature of 150° C. for a heating period of 15 minutes.

STEP C2

A step of curing the printed pattern by an ultraviolet irradiation device. This device had a focus-type reflector umbrella and four high-pressure mercury lamps each having a light-emitting length of 75 cm and an output of 0.6 KW and arrayed parallel to each other at intervals of 15 cm, and was adapted to irradiate the printed matter at a position 10 cm below the lamps. The irradiation time was 5 seconds.

STEP C3

A step of curing the printed pattern by an electron beam irradiating device. This device was of the electrocurtain type having an acceleration voltage of 175 KV and a current value of 10 mA. The dosage was 5 megarads.

STEP D

A step of overprinting the same pattern on the cured printed pattern by the same method as in step A1 or A2.

TABLE 4

| | Resist pattern No. | Ink No. | Material printed | Steps |
|---|---|---|---|---|
| Example | 1 | 1 | F. B | A1–C3 |
| | 2 | 2 | R. B | A1–C2 |
| | 3 | 3 | F. B | A1–C1 |
| | 4 | 4 | R. B | A2–C2 |
| | 5 | 5 | F. B | A2–C1 |
| | 6 | 6 | R. B | A2–C3 |
| | 7 | 7 | F. B | A1–B–C2 |
| | 8 | 8 | R. B | A1–B–C3 |
| | 9 | 9 | F. B | A1–C1–D–C2 |
| | 10 | 10 | R. B | A2–C2–D–C2 |
| | 11 | 11 | F. B | A2–C3–D–C3 |
| | 12 | 10 | R. B | A2–D–C2 |
| | 13 | 9 | F. B | A2–B–C2–D–C2 |
| | 14 | 8 | S. S | A2–C1 |
| | 15 | 7 | S. S | A2–C2–C1 |
| | 16 | 6 | N. S | A2–C3 |
| | 17 | 5 | N. S | A2–B–C2–C1 |
| | 18 | 4 | G | A2–B–C3–D–C3 |
| Comparative Example | 19 | 12 | F. B | A2–C2 |

The designations of the materials printed have the following meanings.
F. B: A polyimide-type flexible copper-clad laminate (copper foil thickness 35 microns)
R.B: A glass epoxy-type hard copper-clad laminate (copper foil thickness 35 microns)
S.S: A stainless steel plate.
N.S: A nickel alloy plate.
G: A hard Pyrex glass plate.

(4) Tests for Resisting Property

The aforesaid resist patterns were subjected to the following various tests for resisting properties.

(I) Test for Etching Resistance

The sample was etched with a ferric chloride solution (46° Baume) as an etchant by a spray-type etching device while maintaining the temperature of the etchant at 40° C. and the spraying pressure at 1.2 kg/cm$^2$.

(II) Test for Soldering Resistance

The sample was soldered in a solder bath at 260° C. for 10 seconds.

(III) Test for Copper Plating Resistance

COPPER SULFATE ELECTROPLATING BATH

This bath contained 120 g/liter of copper sulfate, 215 g/liter of sulfuric acid and 40 g/liter of a brightener and had a pH of 0.2. The sample was immersed in this bath at 25° C. for 30 minutes while applying an electric current of 30 A/foot$^2$.

COPPER PYROPHOSPHATE ELECTROPLATING BATH

This bath contained 22.5 g/liter of copper (II) ion, 1.2 g/liter of ammonia, 175 g/liter of pyrophosphoric acid and 1 g/l of a brightener and had a pH of 8.1 to 8.5. The sample was immersed in this bath at 55° C. for 45 to 60 minutes while applying an electric current of 30 A/foot$^2$.

The sample was tested in these two types of electroplating baths, and the results were comprehensively evaluated.

(IV) Test for Hydrofluoric Acid Resistance

The sample was etched with a 20% aqueous solution of hydrofluoric acid by a spray-type etching device at room temperature and a spray pressure of 1.0 kg/cm$^2$.

The results are summarized in Table 5.

TABLE 5

| Example (Ex.) or Comparative Example (CEx.) | Pattern No. | Test for resisting property | Etching time (seconds) |
| --- | --- | --- | --- |
| Ex. 1 | No. 1 | I | 60 |
| Ex. 2 | No. 2 | I | " |
| Ex. 3 | No. 3 | I | " |
| Ex. 4 | No. 4 | I | " |
| Ex. 5 | No. 5 | I | " |
| Ex. 6 | No. 6 | I | " |
| Ex. 7 | No. 7 | I | " |
| Ex. 8 | No. 8 | I | " |
| Ex. 9 | No. 9 | I | " |
| Ex. 10 | No. 10 | III | — |
| Ex. 11 | No. 11 | II | — |
| Ex. 12 | No. 12 | III | — |
| Ex. 13 | No. 13 | II | — |
| Ex. 14 | No. 14 | I | 140 |
| Ex. 15 | No. 15 | I | 200 |
| Ex. 16 | No. 16 | I | 570 |
| Ex. 17 | No. 17 | I | 570 |
| Ex. 18 | No. 18 | IV | — |
| CEx. 1 | No. 19 | I | 60 |
| CEx. 2 | No. 19 | II | — |

(5) Evaluation

The results of the various tests for resisting properties were evaluated as to the following items, and the results are shown in Table 6.

(i) PRESENCE OR ABSENCE OF HOLES BEFORE AND AFTER THE TEST

The sample was observed by a magnifying glass for the presence or absence of holes such as pinholes and eyeholes.

—: None at all
—: Some present
Δ: Many present
X: Very many present

(ii) REPRODUCIBILITY OF THE PATTERN

The sample was observed by a microscope (magnification 100) after each etching or plating treatment to determine whether the pattern of a minimum line width (50 microns) was reproduced sharply in accordance with the pixels.

a: Reproduced in accordance with the pixels
b: No line thinning, but indentations owing to side etching exist.

(iii) SOLDER HEAT RESISTANCE

After soldering, the sample was observed for the presence or absence of changes such as discoloration, peeling or cracking.

TABLE 6

| Example (Ex.) or Comparative Example (CEx.) | Test for resisting property | Presence or absence of holes before the test for resisting property | Presence or absence of holes after the test for resisting property | Reproducibility of the pattern | Solder heat resistance |
| --- | --- | --- | --- | --- | --- |
| Ex. 1 | I | — | — | b | — |
| Ex. 2 | I | — | — | b | — |
| Ex. 3 | I | — | — | b | — |
| Ex. 4 | I | | | a-b | — |
| Ex. 5 | I | | | a-b | — |
| Ex. 6 | I | | | a-b | — |
| Ex. 7 | I | | | a | — |
| Ex. 8 | I | | | a | — |
| Ex. 9 | I | | | a | — |
| Ex. 10 | III | | | a | — |
| Ex. 11 | II | | | — | No change |
| Ex. 12 | III | | | a | — |
| Ex. 13 | II | | | — | No change |
| Ex. 14 | I | | | a-b | — |
| Ex. 15 | I | | | a | — |
| Ex. 16 | I | | | a-b | — |
| Ex. 17 | I | | | a | — |
| Ex. 18 | IV | | | a | — |
| CEx. 1 | I | X-Δ | X-Δ | a-b | — |

TABLE 6-continued

| Example (Ex.) or Comparative Example (CEx.) | Test for resisting property | Presence or absence of holes before the test for resisting property | Presence or absence of holes after the test for resisting property | Reproducibility of the pattern | Solder heat resistance |
|---|---|---|---|---|---|
| CEx. 2 | II | X-Δ | X-Δ | — | No change |

According to the method of this invention, a resist pattern having a high resolution corresponding to a line width of about 30 microns can be economically produced on a mass production basis. The cured resist pattern has marked resistance to etching, soldering or plating. Moreover, the cured coated film after use can be easily peeled off with a relatively strongly alkaline aqueous solution at room temperature. In particular, since the method of the invention can give a resist pattern free from holes which may cause wire breaks, such as pinholes and eyeholes, a printed circuit board having high reliability can be produced by the method of this invention.

The utility of the present invention has been described in detail hereinabove with reference to the application of the resist pattern to production of printed circuit boards in accordance with this invention. The resist pattern obtained in accordance with the method of this invention is also useful for production of finely worked metallic products such as metallic lead frames for electronic component parts and microporous metallic filters, or for production of a minute pattern on a glass surface by a glass etching method.

What is claimed is:

1. A method of forming a resist pattern, which comprises printing a predetermined pattern on a substrate by a lithographic technique using a resist ink curable by irradiation of an active energy ray and/or heating, said ink consisting essentially of (1) 100 parts by weight of a metal chelate resin obtained by reacting (a) 100 parts by weight of at least one resin having an acid value of 5 to 300 selected from the group consisting of alkyd resins, modified alkyd resins, fatty acid-modified epoxy resins, urethanized oils and maleinized oils and (b) 0.1 to 10 parts by weight of at least one metal compound selected from the group consisting of long chain fatty acid metal salts, metal alcoholates and intramolecular metal complex compounds and (2) 3 to 300 parts by weight of a polymerizable compound containing at least two ethylenically unsaturated bonds per molecule; and curing the printed pattern by irradiating with an acitve energy ray and/or by heating.

2. The method of claim 1 wherein the printed pattern is heated at a temperature of more than room temperature to such an extent that the substrate is not deformed or the pattern is not completely cured, and thereafter, the heated printed pattern is cured by the active energy ray.

3. The method of claim 1 wherein the printed pattern is heated at a temperature of more than room temperature to such an extent that the substrate is not deformed or the pattern is not completely cured, and thereafter, the heated printed pattern is cured by heating.

4. The method of claim 1 wherein the printing of the predetermined pattern is carried out by overprinting the same pattern and the printed pattern is cured by irradiating with an actinic ray.

5. The method of claim 1 wherein the printing of the predetermined pattern is carried out by overprinting the same pattern and the printed pattern is cured by heating.

6. The method of claim 1 wherein the printed pattern is cured by irradiation of the active energy ray, and then the same pattern is overprinted on the cured pattern and then the overprinted pattern is cured by irradiating with an actinic ray.

7. The method of claim 1 wherein the printed pattern is cured by irradiation of the active energy ray, and then the same pattern is overprinted on the cured pattern and then the overprinted pattern is cured by heating.

8. The method of claim 1 wherein the active energy ray is ultraviolet light, and the resist ink contains a photopolymerization initiator.

9. The method of claim 1 wherein the active energy ray is an electron beam.

10. The method of claim 1 wherein the resin (a) is an alkyd resin.

11. The method of claim 10 wherein the alkyd resin is the product produced by the reaction between a polybasic acid, a polyhydric alcohol, and an oil or a long-chain fatty acid; wherein said polybasic acid is selected from the group consisting of aromatic dicarboxylic acids, cyclic aliphatic dicarboxylic acids, saturated aliphatic dicarboxylic acids, unsaturated aliphatic dicarboxylic acids, tricarboxylic acids and tetracarboxylic acids; said polyhydric alcohol is selected from the group consisting of diols in which two alcoholic hydroxyl groups are spaced from each other by 2 to 9 carbon atoms, triols, and tetrols; and the oil or long-chain fatty acid is selected from the group consisting of drying oils, semidrying oils, non-drying oils, and fatty acid constituents of these oils.

12. The method of claim 1 wherein the resin (a) is the modified alkyd resin.

13. The method of claim 12 wherein the modified alkyd resin is selected from the group consisting of rosin-modified alkyd resins, phenol-modified alkyd resins, epoxy resin-modified alkyd resins, amide resin-modified alkyd resins, amino-alkyd co-condensed resins, silicone-modified alkyd resins, styrenated alkyd resins, vinyl toluene-modified alkyd resins, acrylic-modified alkyd resins, acrylonitrile-modified alkyd resins and urethane-modified alkyd resins.

14. The method of claim 1 wherein the resin (a) is the fatty acid-modified epoxy resin.

15. The method of claim 14 wherein the fatty acid-modified epoxy resin is the product obtained by condensing an epoxy resin with an oil or long-chain fatty acid and optionally with an acid anhydride.

16. The method of claim 1 wherein resin (a) is the urethanized oil.

17. The method of claim 16 wherein the urethanized oil is the product obtained by alcoholizing an oil or long-chain fatty acid with a polyhydric alcohol and subjecting the resulting product to addition reaction with a polyisocyanate compound, and optionally reacting the resulting product with an acid anhydride.

18. The method of claim 1 wherein the resin (a) is the maleinized oil.

19. The method of claim 18 wherein the maleinized oil is the product obtained by reacting a drying oil with maleic anhydride and optionally further reacting the product with a polyhydric alcohol.

20. The method of claim 1 wherein the resin (a) has an acid value of from 20 to 100.

21. The method of claim 1 wherein the resin (a) has a long chain fatty acid residue content of at least 20% by weight.

22. The method of claim 1 wherein the metal of the metal compound (b) is selected from the group consisting of Be, Mg, Ca, Sr, Ba, Zn, Cd, Sc, Al, Ti, Zr, V, Cr, Mn, Fe, Co, Ni, Cu and Ce.

23. The method of claim 1 wherein the metal compound (b) is selected from the group consisting of copper(II)octoate, copper (II) ethylacetoacetate-sec-butoxide, copper(II)-n-butoxide, ethylacetoacetate copper-(II)isopropylate, vanadium oxydi-sec-butoxide, diisopropoxyvanadium-bis-(methylacetoacetate), vanadium octoate, isopropoxychromium(III)ethylacetoacetate, chromium octylate, aluminum 2-ethylhexoate, mono-sec-butoxyaluminum-diisopropoxide, ethylacetoacetate aluminum-diisopropoxide, aluminum-diisobutoxide mono(methylacetoacetate), aluminum tris(ethylacetoacetate), bis-(isopropoxy)-bis-(acetylacetone)-titanium, titanium lactate, titanium lactate ethyl ester, titanium stearate, di-n-butoxy-bis(triethanolamine)titanate, tetraoctylene glycol titanate, diisopropoxy-bis(ethylacetoacetate)titanate, zirconium ammonium lactate, diisopropoxy-bis(acetylacetonate)zirconate, n-butoxy-tris-(ethylacetoacetate)zirconate, di-isopropoxy-(monoacetylacetonate)monoethylacetoacetate zirconate, zirconium stearate trisoctoate, zirconium laurate tris(2-ethylhexoate), manganese octylate, manganese(II)ethylacetoacetate-monoisopropoxide, manganese (II) diisopropoxide, iron(III)isopropoxide, iron(III)octylate, iron(III)-di-isobutoxide mono(ethylacetoacetate), cobalt(III)-diisopropoxide acetylacetonate, cobalt(III)-diisopropoxide-methyl acetoacetate and cobalt octylate.

24. The method of claim 1 wherein the reaction between the at least one resin (a) and the at least one metal compound (b) is carried out at a temperature of 90° to 120° C. for 0.5 to 2.0 hours.

25. The method of claim 1 wherein the polymerizable compound (2) is selected from the group consisting of poly(meth)acrylate of ethylene glycol, polyethylene glycol, propylene glycol, polypropylene glycol, 1,3-butylene glycol, tetramethylene glycol, hexamethylene glycol, trimethylolpropane, glycerol, pentaerythritol, di(meth)acrylates of a diol obtained by adding at least 2 moles of ethylene oxide or propylene oxide to 1 mole of neopentyl glycol, di- or tri-(meth)acrylates of a triol obtained by adding at least 3 moles of ethylene oxide or propylene oxide to 1 mole of trimethylolpropane, and di(meth)acrylates of a diol obtained by adding at least 2 moles of ethylene oxide or propylene oxide to 1 mole of bisphenol A.

26. The method of claim 1 wherein the polymerizable compound (2) is a polymerizable prepolymer selected from the group consisting of prepolymer of epoxy(meth)acrylates or their long-chain fatty acid-modified products obtained by reacting a bisphenol A-type epoxy resin with (meth)acrylic acid, and optionally with a long-chain fatty acid; and epoxy(meth)acrylate having a carboxyl group obtained by adding a dibasic acid anhydride, a tetrabasic acid dianhydride or trimellitic anhydride to epoxy(meth)acrylate having a hydroxyl group.

* * * * *